(12) United States Patent
Model

(10) Patent No.: US 11,789,102 B2
(45) Date of Patent: Oct. 17, 2023

(54) MAGNETIC RESONANCE IMAGING DEVICE

(71) Applicant: Siemens Healthcare GmbH, Erlangen (DE)

(72) Inventor: Volker Model, Furth (DE)

(73) Assignee: SIEMENS HEALTHCARE GMBH, Erlangen (DE)

( * ) Notice: Subject to any disclaimer, the term of this patent is extended or adjusted under 35 U.S.C. 154(b) by 0 days.

(21) Appl. No.: 17/527,541

(22) Filed: Nov. 16, 2021

(65) Prior Publication Data

US 2022/0155393 A1   May 19, 2022

(30) Foreign Application Priority Data

Nov. 17, 2020   (DE) .................. 10 2020 214 443.5

(51) Int. Cl.
*G01R 33/421*   (2006.01)
*G01R 33/385*   (2006.01)

(52) U.S. Cl.
CPC ......... *G01R 33/421* (2013.01); *G01R 33/385* (2013.01)

(58) Field of Classification Search
CPC .... G01R 33/421; G01R 33/385; G01R 33/42; A61B 5/055; H05K 9/0007
See application file for complete search history.

(56) References Cited

U.S. PATENT DOCUMENTS

| | | | |
|---|---|---|---|
| 3,222,449 A | 12/1965 | Garwin et al. | |
| 5,864,331 A * | 1/1999 | Anand | G01R 33/283 345/905 |
| 6,288,545 B1 * | 9/2001 | King | G01R 33/58 324/318 |
| 2002/0160726 A1 | 10/2002 | Konig | |
| 2004/0225213 A1 * | 11/2004 | Wang | A61K 49/1818 600/421 |
| 2012/0105059 A1 * | 5/2012 | Doerr | A61N 1/0484 324/318 |
| 2017/0261575 A1 | 9/2017 | Model | |

FOREIGN PATENT DOCUMENTS

EP   1244223 B1   8/2006

OTHER PUBLICATIONS

Sekels, Dietrich et al; "Sekels GmbH: Theorie und Praxis bei der Ermittlung von Schirmfaktoren magnetischer Abschirmungen"; UKMAG, Hanau 2010 [recherchiert am Sep. 6, 2021] (betreffend Zeitstempel bzw. URL vgl. Wikipedia-Weblinks: https://de.wikipedia.org/w/index.php?title=Abschirmung_(Elektrotechnik)&oldid=185250843);.

* cited by examiner

*Primary Examiner* — G. M. A Hyder
(74) *Attorney, Agent, or Firm* — Harness, Dickey & Pierce, P.L.C.

(57) ABSTRACT

A magnetic resonance imaging device includes at least one magnetic shielding element, an electrical component and a coil arrangement including at least two coil rings. In an embodiment, the coil rings are arranged offset along a longitudinal direction of a patient receptacle and the coil arrangement is embodied to form a magnetic field in an inner volume surrounded partially by the coil rings and at least partially including the patient receptacle. Further, in an embodiment, the shielding element and the electrical component outside of the inner volume are arranged in the longitudinal direction centrally between the coil rings and the shielding element shields the electrical component from the magnetic field outside of the inner volume.

19 Claims, 4 Drawing Sheets

MAGNETIC RESONANCE IMAGING DEVICE

PRIORITY STATEMENT

The present application hereby claims priority under 35 U.S.C. § 119 to German Patent application number 10 220 214 443.5 filed Nov. 17, 2020, the entire contents of which are hereby incorporated herein by reference.

FIELD

The application generally relates to a magnetic resonance imaging device comprising at least one magnetic shielding element, at least one electrical component and a coil arrangement comprising at least two coil rings.

BACKGROUND

In principle, magnetic resonance imaging is dependent upon the generation of strong magnetic fields in the region of a patient receptacle of the magnetic resonance imaging device. These strong magnetic fields also influence, in addition to the patient receptacle or a patient arranged in the patient receptacle, further components of the imaging device and/or apparatuses arranged in an environment of the imaging device, since in addition to the magnetic field in the patient receptacle a stray field outside of the patient receptacle or outside of the inner volume comprising the patient receptacle is also generated by the coil arrangement.

In particular with an electrical circuit arrangement of the magnetic resonance imaging device, it may be necessary to shield this entirely or at least partially from the magnetic field generated by the coil arrangement, in order to ensure correct operation of the electrical circuit arrangement. To this end, it is known, for instance, for the entire magnetic resonance imaging device to be arranged in a shielded room, wherein electrical components, which cannot be operated in the stray field, are arranged outside of the room and connected to the imaging device.

SUMMARY

The inventors have discovered that it may also be necessary, however, to shield an electrical component integrated into the magnetic resonance imaging device if an arrangement of this component outside of the shielded room is not possible or not desired. For a shielding element used in the process, the inventors have discovered that it is desirable for the imaging via the imaging device to be influenced as little as possible.

At least one embodiment of the invention is directed to a magnetic resonance imaging device with a shielding element, which enables an improved magnetic shielding.

At least one embodiment of the invention is directed to a magnetic resonance imaging device comprising at least one magnetic shielding element, at least one electrical component and a coil arrangement comprising at least two coil rings, wherein provision is made in accordance with at least one embodiment of the invention for the shielding element and the electrical component outside of the inner volume in the longitudinal direction to be arranged centrally between the coil rings, and wherein the shielding element shields the electrical component from the magnetic field outside of the inner volume.

At least one embodiment of the invention is directed to a magnetic resonance imaging device, comprising:

at least one magnetic shielding element;
at least one electrical component; and
a coil arrangement including at least two coil rings arranged offset along a longitudinal direction of a patient receptacle, the coil arrangement being embodied to form a magnetic field in an inner volume partially surrounded by the at least two coil rings and at least partially surrounding the patient receptacle;
wherein the at least one magnetic shielding element and the at least one electrical component are arranged outside of the inner volume, in a longitudinal direction centrally between the at least two coil rings; and
wherein the at least one electrical component is configured to be shielded by the at least one magnetic shielding element, from a magnetic field outside of the inner volume.

BRIEF DESCRIPTION OF THE DRAWINGS

Further advantages and details of the present invention result from the example embodiments described below and on the basis of the drawing, in which.

DETAILED DESCRIPTION OF THE EXAMPLE EMBODIMENTS

Figure 1:
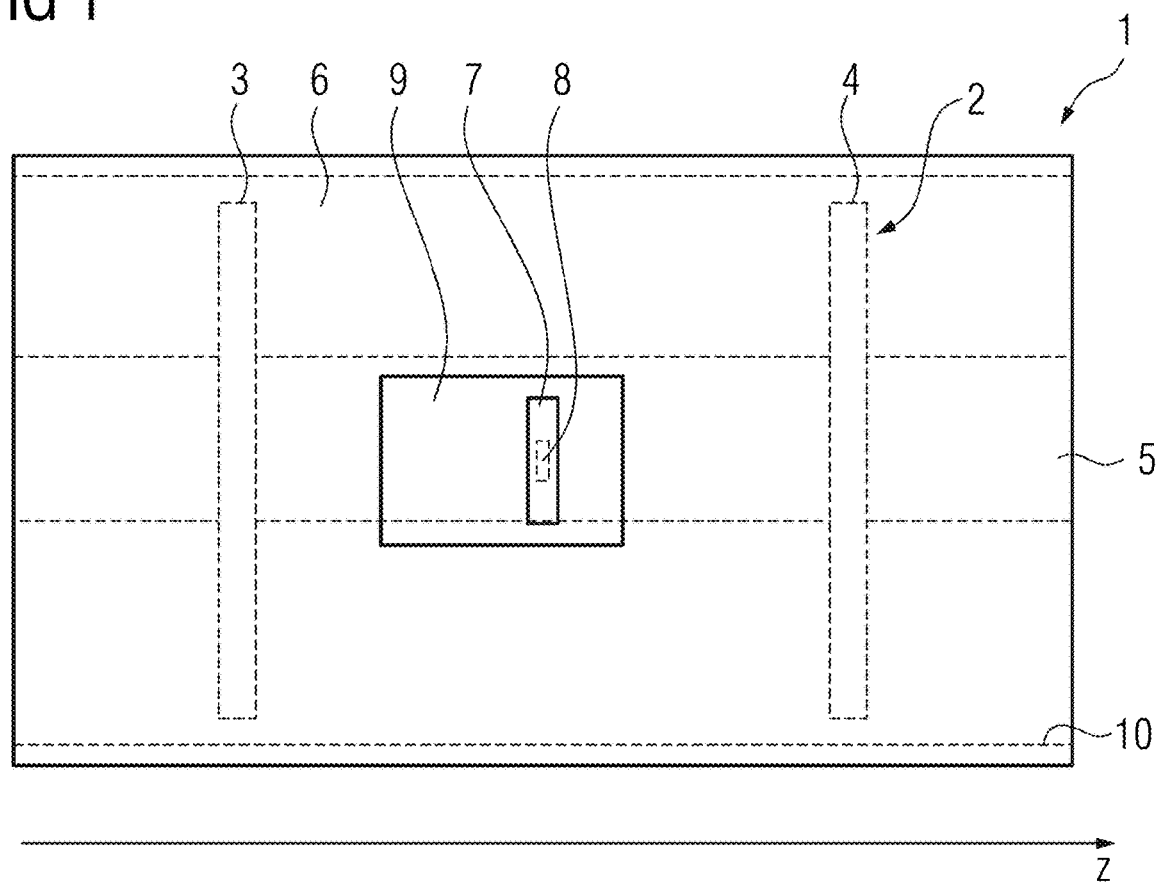
FIG. 1 shows an example embodiment of an inventive magnetic resonance imaging device.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various example embodiments will now be described more fully with reference to the accompanying drawings in which only some example embodiments are shown. Specific structural and functional details disclosed herein are merely representative for purposes of describing example embodiments. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated. At least one embodiment of the present invention, however, may be embodied in many alternate forms and should not be construed as limited to only the example embodiments set forth herein.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "example" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Before discussing example embodiments in more detail, it is noted that some example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments of the present invention. This invention may, however, be embodied in many alternate forms and should not be construed as limited to only the embodiments set forth herein.

Units and/or devices according to one or more example embodiments may be implemented using hardware, software, and/or a combination thereof. For example, hardware devices may be implemented using processing circuitry such as, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner. Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

In this application, including the definitions below, the term 'module' or the term 'controller' may be replaced with the term 'circuit.' The term 'module' may refer to, be part of, or include processor hardware (shared, dedicated, or group) that executes code and memory hardware (shared, dedicated, or group) that stores code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

At least one embodiment of the invention is directed to a magnetic resonance imaging device comprising at least one magnetic shielding element, at least one electrical component and a coil arrangement comprising at least two coil rings, wherein provision is made in accordance with at least one embodiment of the invention for the shielding element and the electrical component outside of the inner volume in the longitudinal direction to be arranged centrally between the coil rings, and wherein the shielding element shields the electrical component from the magnetic field outside of the inner volume.

In at least one embodiment, the coil arrangement comprising the at least two coil rings is used to generate a magnetic field, which is homogenous at least in sections in an image recording region of the patient receptacle which is also referred as the "field of view", in order to enable a magnetic resonance imaging there.

In at least one embodiment, the coil rings arranged offset along the longitudinal direction correspond in terms of their active principle at least substantially to a Helmholtz coil, via which a homogenous magnetic field can be generated in regions in the region of the inner volume enclosed at least partially by the coil rings. This may be carried out by the magnetic fields generated by the two coil rings being overlaid constructively in the region of a central axis of the inner volume enclosed by the coil rings. To this end, a current can pass through the coil rings in the same direction in each case.

In a region outside of the inner volume and centrally between the coil rings, in at least one embodiment the magnetic fields of the two coil rings overlay one another destructively, however, so that overall, a lower magnetic field strength is formed there. Via at least one embodiment of the inventive arrangement of the shielding element and the electrical component to be shielded in this region, an improved shielding effect is brought about by the shielding element and thus an improved protection of the electrical component shielded by the shielding element.

It may be advantageous for a local shielding to be generated by the shielding element, which only shields the at least one electrical component to be shielded. As a result, the shielding element in at least one embodiment can be designed in the scale of the electrical component to be shielded or the electrical components to be shielded. The shielding element extends in particular in the longitudinal direction only across a short part of the stretch between the coil rings. The shielding element can also be designed to be short in the radial direction. As a result, it is possible for the shielding element only to be exposed to a small gradient of the stray field, in other words the magnetic field of the coil arrangement outside of the inner volume.

In the peripheral direction of the coil rings, the extent of the shielding element is basically not restricted, since for reasons of symmetry the region with the low field strength extends in a ring-shaped manner between the coil rings. In at least one embodiment, the shielding element however preferably also extends in the peripheral direction only across one part of the periphery, in order to enable a compact design of the shielding element. The use of the shielding element makes it possible to advantageously dispense with the use of large-area shieldings.

Via the shielding element, it is advantageously possible in at least one embodiment for electrical components, which comprise at least one magnetizable element, to be arranged close to the coil arrangement of the magnetic resonance imaging device, without unwanted effects during operation of the electrical component, for instance a complete magnetization of a magnetizable element of the electrical component or suchlike, occurring as a result of the magnetic stray field of the coil rings. Forces also acting on the electrical components, which are generated by the magnetic field of the magnetic resonance imaging device, can advantageously be minimized. Furthermore, the influence which the shielding element has on the field generation in the magnetic resonance imaging device and therefore also on the imaging, can also be advantageously reduced, as explained in more detail below.

The positioning of the shielding element is based here on the arrangement of the coil rings of the coil arrangement used to generate the magnetic field and can also be applied in more than two coil rings in at least one embodiment, if these are arranged for instance in symmetry about a central point or a central axis or a central plane. The coil rings can be arranged about a supporting ring also referred to as a buttress ring, for instance, wherein the coil ring is formed for instance by an electrical conductor wound around the supporting ring, in particular a superconductor. It is possible for the coil arrangement to comprise further coils, which are used for instance to improve the homogeneity of the magnetic field generated by the coil arrangement in the region of the patient receptacle. The longitudinal direction, along which the coil rings are arranged offset, corresponds to the longitudinal direction of the patient receptacle and is also referred to as the z-direction.

In accordance with at least one embodiment of the invention, provision can be made for the shielding element to at least partially surround a shielding volume, which is shielded by the shielding element, wherein the electrical component is arranged in the shielding volume. This makes it possible for the electrical component, which is an integral part of an electrical circuit arrangement comprising a number of components, for instance, to be shielded magnetically in the shielding volume. The shielding element is shaped here so that in the shielding volume it brings about a magnetic shielding of the electrical component from the stray field of the coil arrangement, in other words the magnetic field generated by the coil arrangement outside of the inner volume.

Provision can be made in accordance with at least one embodiment of the invention for the shielding element to have a U-shaped cross-section, wherein the shielding element surrounds the shielding volume on at least three sides. The arrangement of the shielding element in respect of the coil rings of the coil arrangement advantageously makes it possible to be able to dispense with completely enclosing the shielding volume via the shielding element. This reduces the quantity of material required to form the shielding element, which has a particularly advantageous effect on the homogeneity of the magnetic field generated by the coil arrangement. It is therefore possible to advantageously achieve a shielding of the shielding volume with as low a quantity of material as possible or as low a mass of the shielding element as possible.

Via the U shape of the cross-section of the shielding element, in at least one embodiment the shielding volume is surrounded on at least three sides, namely by the closed side of the U-shaped cross-section facing the open side and by the two limbs of the U-shaped cross-section. The shielding element can be arranged in particular so that the limbs of the U-shaped cross-section extend along the longitudinal direction at a distance from one another and in the radial direction of the coil rings.

Provision can be made in accordance with at least one embodiment of the invention for the shielding element alternatively also to be cup-shaped, box-shaped or trough-shaped, wherein the shielding element completely surrounds the shielding volume with the exception of the open side of the shielding element. A cup-shaped, box-shaped or trough-shaped shielding element can have a base section, from which one or more wall sections extend depending on the cross-section geometry, wherein the shielding volume comprises or is bound by the base section and the wall section or sections. In addition to a rectangular cross-sectional shape with four wall sections, oval or round shapes with just one wall section are also conceivable. Compared with the base section, the shielding element has an open side. This open side makes it possible for an electrical component fastened to a planar support element to be arranged in the shielding volume of the shielding element shifted thereabove, for instance, so that the electrical component with the exception of the open side is completely surrounded by the shielding element. The base section can be straight or arched, wherein with an arched section the wall sections extend from the concave side of the base section or the inner volume enclosed by the shielding element adjoins the concave side of the base section.

By comparison with a shielding element with a U-shaped cross-section, a cup-shaped, box-shaped or trough-shaped shielding element encloses the inner volume further, so that an improved shielding can be reached as a function of the field profile of the stray field to be shielded.

In accordance with at least one embodiment of the invention, the open side of the U-shaped cross-section or the open side of the shielding element can point to the inner volume. Accordingly, the closed side of the U-shaped cross-section or a base section of the U-shaped shielding element, which faces the open side, or a base section of a cup-shaped, box-shaped or trough-shaped shielding element, which faces the open side, points away from the inner volume and is therefore further away from the patient receptacle or the image recording region in the patient receptacle. This further reduces the influence that the shielding element has on the magnetic field generation via the coil arrangement.

In a preferred embodiment of the invention, provision can be made for an air gap to be embodied and/or an amagnetic spacer element to be arranged between the electrical component and the shielding element. The air gap and/or the amagnetic spacer element prevent a magnetic flux guided through the shielding element from entering into the electrical component. A magnetic contact resistance between the shielding and the electrical component is therefore increased by the formation of the air gap or the arrangement of the amagnetic spacer element between the shielding element and the electrical component, in order to improve the shielding effect of the shielding element.

In accordance with at least one embodiment the invention, provision can be made for the shielding element in the peripheral direction or tangentially to the peripheral direction of the coil rings to be longer than in the longitudinal direction and/or in the radial direction of the coil rings. The shielding element therefore preferably extends with its longest extent in the direction of the periphery of the coil rings or tangentially to the direction of the periphery of the coil rings. In particular, as a result of the narrow design of the shielding element in respect of the longitudinal direction, it is possible for the shielding element only to extend in a region with a small gradient of the stray field. It is possible for the shielding element to extend about the entire periphery of the inner volume, so that the shielding element has a ring shape. It is also possible, however, for the shielding element only to extend across a section of this periphery, wherein in this peripheral direction the shielding element is straight or, in particular according to the radius of this periphery, arched.

A shielding element with a U-shaped cross-section is preferably arranged so that the limbs of the U-shaped section are arranged at a distance in the longitudinal direction and extend in the radial direction of the coil rings. The open side of the U-shaped cross-section extends here in the longitudinal direction and in the peripheral direction and preferably points to the inner volume. A cup-shaped, box-shaped or trough-shaped shielding element is preferably likewise arranged so that the open side of the shielding element points to the inner volume.

In at least one embodiment, the shielding element in the radial direction can have a length of between 5 cm and 25 cm, in particular 10 cm, for instance. In the longitudinal direction the shielding element can also have a length of between 5 cm and 25 cm, in particular 10 cm. In the peripheral direction of the coil rings or tangentially to the peripheral direction of the coil rings, the shielding element can have a length between 15 cm and 50 cm, in particular 25 cm.

In accordance with at least one embodiment of the invention, provision can be made for the shielding element to be made at least partially of iron. For instance, the shielding element can include construction steel and have a material strength or a wall thickness of between 5 mm and 15 mm, in particular 10 mm. The use of a shielding element being made at least partially of iron is advantageous in that compared with other materials for magnetic shielding iron has a higher saturation magnetization. This prevents a saturation of the magnetization of the shielding element in the arrangement of the shielding element between the coil rings. In particular, since in these regions magnetic flux densities in the region of between 50 mT and 500 mT may also be present in air in these regions, a high saturation magnetization of the shielding element is desirable.

In a preferred embodiment of the invention, provision can be made for the magnetic resonance imaging device to have an inner cover, which surrounds the coil arrangement, wherein the shielding element is arranged on the inner cover. The inner cover can have, for instance, at least substantially the shape of a cylinder casing. The inner cover can surround a coolant required to generate a superconductivity in the coil arrangement. The cover of the shielding element can be arranged or fastened here on an outer side, in other words a side of the inner cover which opposes the inner volume. The fastening can take place directly or indirectly by way of at least one support element.

In this way, the shielding element and the at least one electrical component shielded by the shielding element can be arranged in an interior of the magnetic resonance imaging device. The inner cover, which surrounds the coil arrangement, can for its part be covered by an outer device cover of the magnetic resonance imaging device, which, in the arrangement of the shielding element on the inner cover, also encases the shielding element and the electrical component arranged therein and/or an electrical circuit arrangement comprising the electrical component. In an at least substantially cylinder casing-shaped embodiment of the inner cover, the longest extent of the shielding element can extend in particular in the peripheral direction or tangentially to the peripheral direction of the inner cover, wherein the shielding element can be arranged in particular at any position of the inner cover or at any position about the inner cover.

For the electrical component, provision can be made according to at least one embodiment of the invention for it to be a coil comprising a magnetizable core and/or a transformer comprising a magnetizable core. Further electrical components, which embody an electrical circuit arrangement for instance with the at least one electrical component arranged in the shielding element, can be arranged adjacent to the shielding element at any sides if no magnetic shielding is required herefor. In this way, only the components for which a magnetic shielding is also required can be shielded by the shielding element. This advantageously reduces the volume or the mass of the shielding element and thus the quantity of material required to form the shielding element.

FIG. 1 shows an example embodiment of a magnetic resonance imaging device 1. The magnetic resonance imaging device 1 comprises a coil arrangement 2, which comprises at least two coil rings 3, 4. The coil rings 3, 4 can be arranged e.g. along support rings of the magnetic resonance imaging device, which are also referred to as buttress rings. The coil rings 3, 4 are arranged offset along a longitudinal direction of a patient receptacle 5 of the magnetic resonance imaging device 1. The longitudinal direction corresponds to the z-axis shown in FIG. 1. The coil arrangement 2 is embodied to generate a homogenous magnetic field at least in regions in an image recording region, in an inner volume 6 at least partially enclosing the patient receptacle 5.

The magnetic resonance imaging device 1 further comprises a magnetic shielding element 7, which shields at least one electrical component 8 of an electrical circuit arrangement 9 of the magnetic resonance imaging device 1. The shielding element 7 and the electrical component 8 are arranged here outside of the inner volume 6 and in the longitudinal direction centrally between the coil rings 3, 4. This makes it possible to achieve an advantageous magnetic shielding of the at least one electrical component 8. The electrical component 8 can be e.g. a coil with a magnetizable core and/or a transformer comprising a magnetizable core. The electrical component 8 is an integral part of the electrical circuit arrangement 9, wherein further components of the electrical circuit arrangement 9, which do not require a shielding, are arranged adjacent to the shielding element and a shielding of the shielding element 7 is only carried out for the at least one electrical component 8. The arrangement of the shielding element 7 centrally between the coil rings 3, 4 advantageously brings about an arrangement of the shielding element 7 in a region with a comparatively low magnetic field strength.

Figure 2:
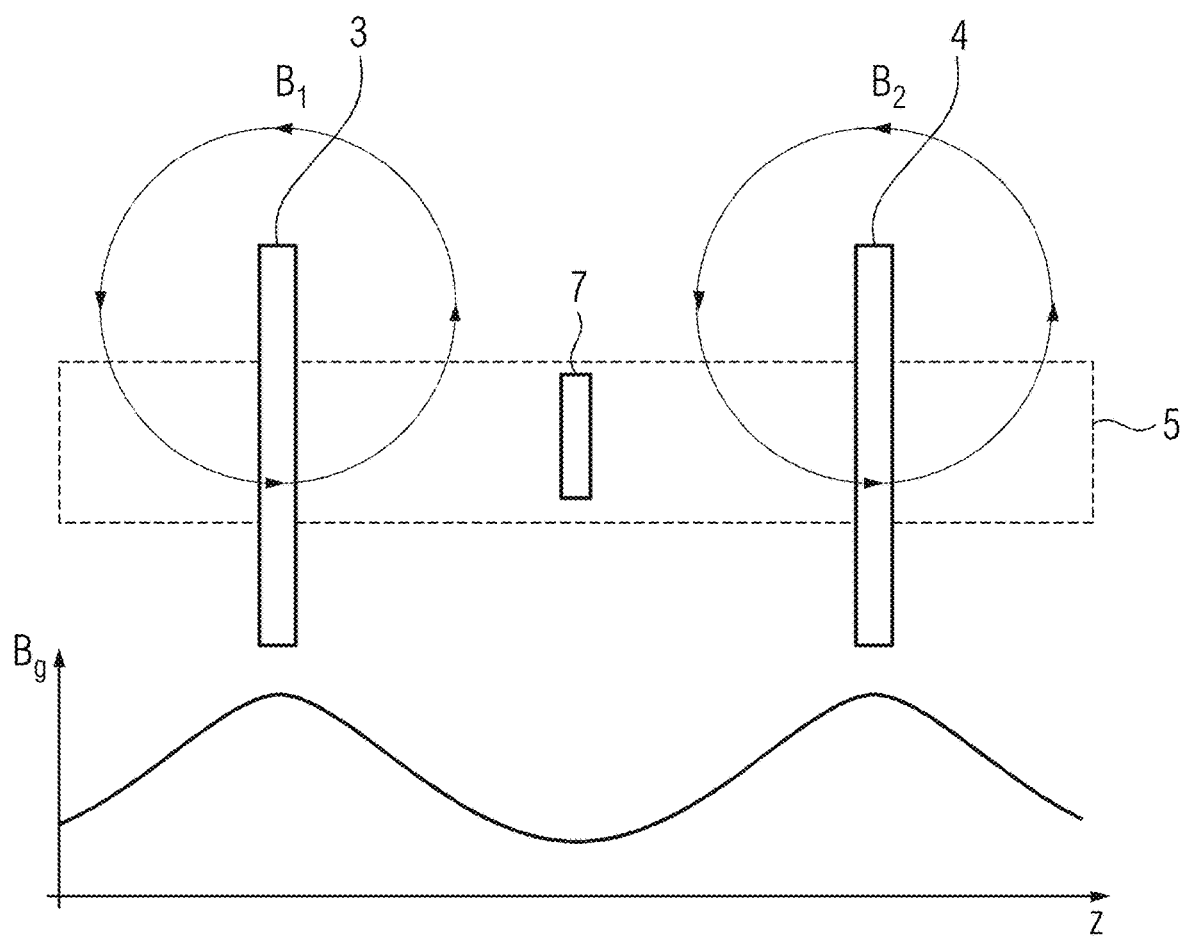
FIG. 2 shows a schematic diagram to illustrate the arrangement of the shielding element.

As shown schematically in FIG. 2, the coil rings 3, 4 are used to generate a homogenous magnetic field in the region of the patient receptacle 5. The coil rings 3, 4 here at least substantially form a Helmholtz coil, so that as homogenous a magnetic field as possible can be generated in an image recording region in the patient receptacle and between the coil rings 3, 4.

In order to illustrate the field generation by the coil rings 3, 4, FIG. 2 shows a field line of a magnetic flux density $B_1$ of the first coil ring 3 and a field line of the magnetic flux density $B_2$ of the second coil ring 4. As can be seen, the field lines in the longitudinal direction also in the inner volume 6 and in particular in the patient receptacle 5 run in the same direction. This results in the field lines in the region centrally between the coil rings 3, 4 and outside of the inner volume 6, in other words in the region in which the shielding element 7 is arranged, running in different directions. As a result, the magnetic flux density $B_1$ of the first coil ring 3 and the magnetic flux density $B_2$ of the second coil ring 4 overlay one another destructively so that overall there is no or at least only a minimal magnetic flux density.

As shown schematically in the diagram, an overall magnetic flux density $B_g$ of the coil arrangement 2, which varies along the longitudinal direction, is produced outside of the inner volume 6. As can be seen, the shielding element 7 arranged centrally between the coil rings 3, 4 is arranged in a region with as a low magnetic flux density $B_g$ as possible. The shielding element 7 is further advantageously formed so that its extent in the longitudinal direction and its extent in the radial direction of the coil rings 3, 4 is lower in each case than an extent of the shielding element 7 in the peripheral direction of the coil rings 3, 4.

It is possible for the shielding element 7 to extend about the entire periphery of the inner volume 6, so that the shielding element has a ring shape. It is also possible, however, for the shielding element to extend, as shown, only across one section of this periphery, wherein the shielding element 7 in this peripheral direction is straight or, in particular according to the radius of the periphery, arched. The shielding element is embodied in the longitudinal direction and in the radial direction of the coil rings 3, 4 to be shorter in each case than in the peripheral direction. This means that the shielding element 7 in the longitudinal direction and in the radial direction in each case only extends in a region with a minimal gradient of the entire magnetic flux density $B_g$ of the coil rings 3, 4.

Figure 3:
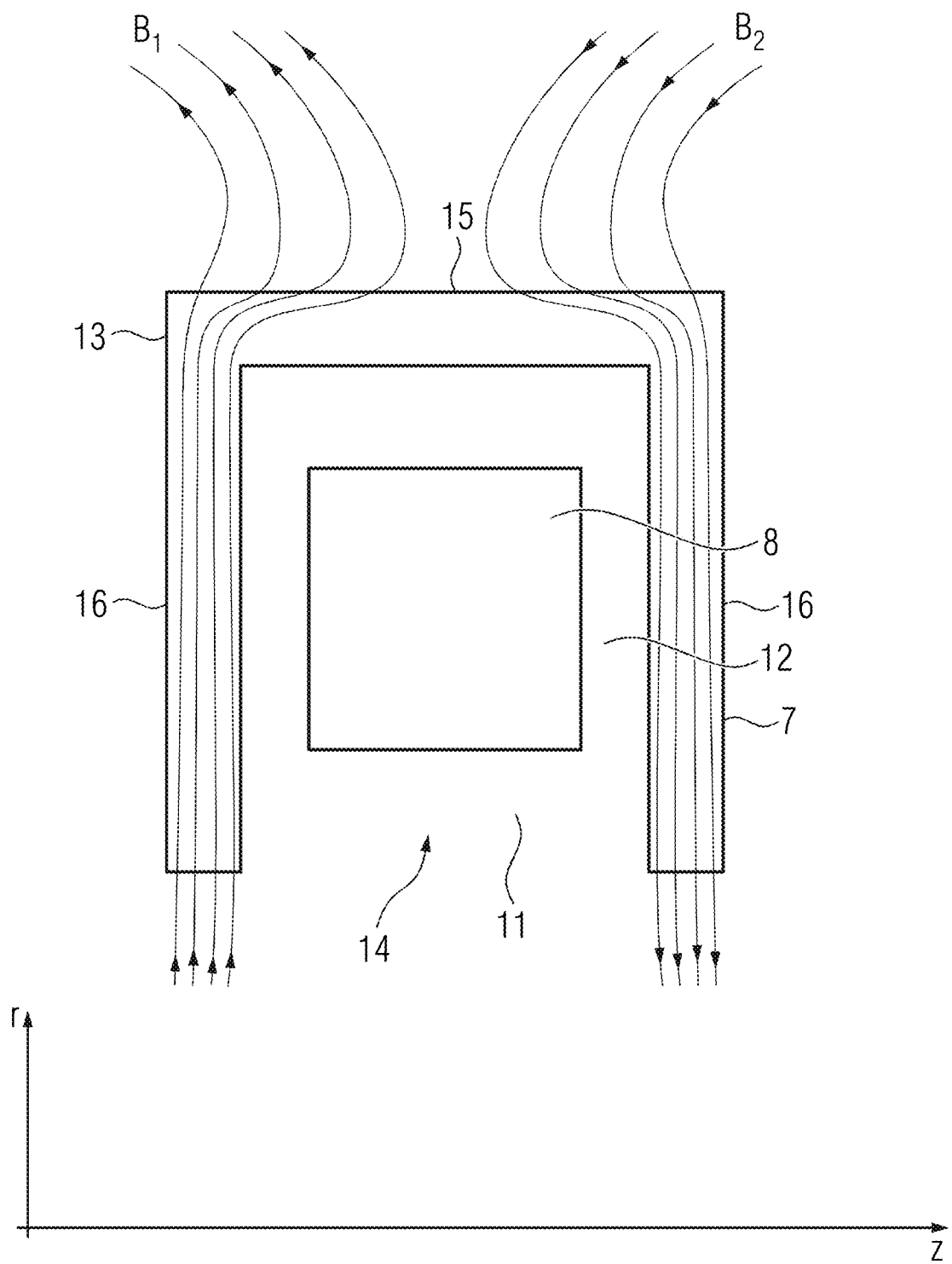
FIG. 3 shows a cross-section of an example embodiment of the shielding element of the example embodiment of the inventive magnetic resonance imaging device.

In FIG. 3, the cross-section of an example embodiment of the shielding element 7 is shown. The shielding element 7 at least partially surrounds a shielding volume 11, in which the electrical component 8 is arranged. An air gap 12 is formed between the electrical component 8 and the interior of the shielding element 7. The air gap 12 prevents the magnetic flux guided through the shielding element, which is shown schematically by the field line sections of the magnetic fluxes $B_1$ and $B_2$, from being able to pass into the electrical component 8. In addition or alternatively to the air gap 12, an amagnetic spacer element can also be arranged between the shielding element 7 and the electrical component 8. The air gap or the spacer element can have a thickness of between 0.5 cm and 1.5 cm, in particular 1 cm.

The shielding element 7 comprises a U-shaped cross-section 13. The open side 14 of the U-shaped cross-section 13 is arranged here in the direction of the inner volume 6, in other words pointing to the patient receptacle 5. This is advantageous in that the closed side 15 of the U-shaped cross-section 13 facing the open side 14 is arranged at a further distance from the inner volume 6 or an image recording region in the patient receptacle 5. This reduces the influence that the shielding element 7 has on the formation of the magnetic field, in particular in the image recording region.

The limbs 16 of the U-shaped cross-section 13 can have a length of between 5 cm and 25 cm, in particular 10 cm, in the radial direction r of the coil rings 3, 4 in each case. The open side 14 and the side 15 facing the open side can also have an extent of between 5 cm and 25 cm, in particular 10 cm, in the longitudinal direction in each case. The length of the shielding element 7 along the peripheral direction or tangentially to the peripheral direction, in other words orthogonally to the plane of projection in FIG. 3, is longer than the limbs 16 and longer than the open side 14 and the closed side 15. The length of the shielding element in the peripheral direction or tangentially to the peripheral direction can amount to between 5 cm and 50 cm, in particular 25 cm. The shielding element 7 can consist at least partially of iron, in particular of construction steel. The material strength of the shielding element 7 can amount to between 5 mm and 15 mm, in particular 10 mm.

Figure 4:
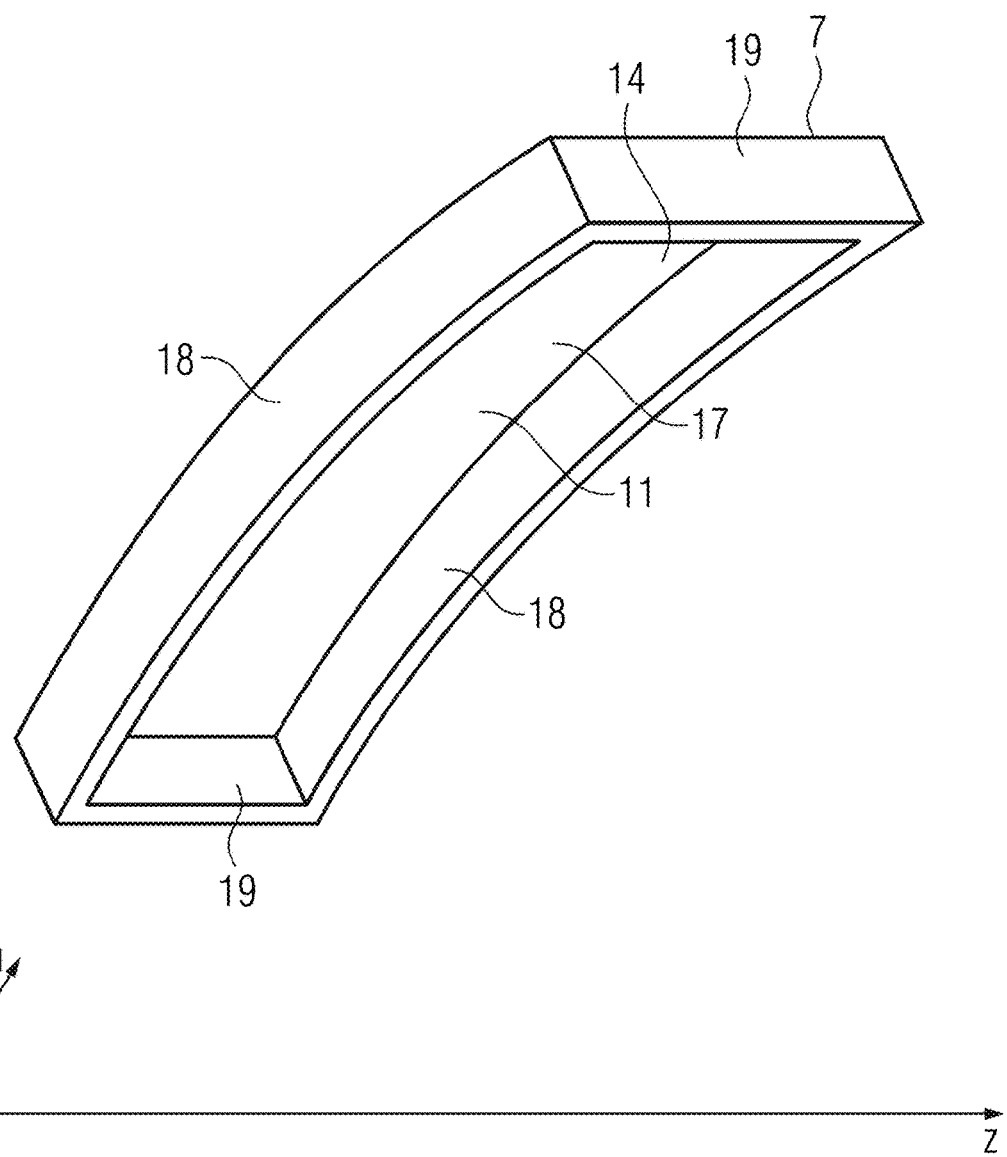
FIG. 4 shows a perspective view of a further example embodiment of the shielding element of the example embodiment of the inventive magnetic resonance imaging device.

FIG. 4 shows a perspective view of a further example embodiment of a shielding element 7. The shielding element 7 has a base section 17 and four wall sections 18, 19, which form a trough shape of the shielding element. The base section 17 is arched along the peripheral direction U, wherein the wall sections 18, 19 connect to the concave side of the base section 17. The base section 17 and the wall sections 18 enclose the shielding volume 11 of the shielding element 7 with the exception of the open side 14 of the shielding element 7 facing the base section 17.

The length of the wall sections 18, 19 in the radial direction r and in the longitudinal direction z can amount to between 5 cm and 25 cm, in particular 10 cm. The length of the wall sections 19 and the base section 17 in the longitudinal direction z can also amount to between 5 cm and 25 cm, in particular 10 cm. In the peripheral direction U, the base section 17 and the wall sections 18 can have an extent of between 5 cm and 50 cm, in particular 25 cm, wherein the shielding element in the peripheral direction U is in particular longer than in the radial direction r and the longitudinal direction z.

Alternatively, it is possible for the base section 17 also to be embodied to be straight, so that it extends tangentially to the peripheral direction U and a box shape of the shielding element 7 is produced. In addition, or alternatively, the extent of the shielding element 7 in the peripheral direction or tangentially to the peripheral direction can correspond at least substantially to the extent of the shielding element in the longitudinal direction, so that a cup shape of the shielding element is produced.

As shown in FIG. 1, the shielding element 7 is arranged on an inner cover 10, which surrounds the coil arrangement 2, and is fastened there directly or indirectly by way of at least one support element. The electrical circuit arrangement 9 or a support element holding the electrical circuit arrangement 9 can also be fastened to the inner cover 10. The inner cover 10 can surround e.g. a volume through which a coolant can flow for generating superconductivity in the coil rings 3, 4 and/or in further components of the coil arrangement 2. Alternatively, another type of arrangement and/or fastening of the electrical component 8 and/or the shielding element 7 in the magnetic resonance imaging device 1 is also possible. In this way any types of support structures, which hold the electrical component 8 and/or the shielding element 7 in the magnetic resonance imaging device 1 in a fixed position, can be used.

Although the invention has been illustrated and described in more detail by the preferred example embodiment, the invention is not restricted by the disclosed examples and other variations can be derived by the person skilled in the art without departing from the scope of protection of the invention.

Of course, the embodiments of the method according to the invention and the imaging apparatus according to the invention described here should be understood as being example. Therefore, individual embodiments may be expanded by features of other embodiments. In particular, the sequence of the method steps of the method according to the invention should be understood as being example. The individual steps can also be performed in a different order or overlap partially or completely in terms of time.

The patent claims of the application are formulation proposals without prejudice for obtaining more extensive patent protection. The applicant reserves the right to claim even further combinations of features previously disclosed only in the description and/or drawings.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

None of the elements recited in the claims are intended to be a means-plus-function element within the meaning of 35 U.S.C. § 112(f) unless an element is expressly recited using the phrase "means for" or, in the case of a method claim, using the phrases "operation for" or "step for."

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A magnetic resonance imaging device, the magnetic resonance imaging device comprising:
    at least one magnetic shielding element, the at least one magnetic shielding element having a U-shaped cross-section to surround a shielding volume on three sides, the shielding volume being shielded by the at least one magnetic shielding element from a magnetic field;
    at least one electrical component in the shielding volume; and
    a coil arrangement including at least two coil rings, the at least two coil rings being offset along a longitudinal direction of a patient receptacle, and the coil arrangement being configured to form the magnetic field in an inner volume, the inner volume being partially surrounded by the at least two coil rings, and the patient receptacle being at least partially surrounded by the inner volume, wherein
        the at least one magnetic shielding element and the at least one electrical component are outside of the inner volume and are centrally between the at least two coil rings in a longitudinal direction of the at least two coil rings, and
    the at least one magnetic shielding element is configured to shield the at least one electrical component from the magnetic field.

2. The magnetic resonance imaging device of claim 1, wherein
    the at least one magnetic shielding element is cup-shaped, box-shaped or trough-shaped, and
    the at least one magnetic shielding element completely surrounds the shielding volume and includes an open side.

3. The magnetic resonance imaging device of claim 2, wherein the open side is adjacent to the inner volume.

4. The magnetic resonance imaging device of claim 2, wherein at least one of
    an air gap is between the at least one electrical component and the at least one magnetic shielding element, or
    an amagnetic spacer element is between the at least one electrical component and the at least one magnetic shielding element.

5. The magnetic resonance imaging device of claim 2, wherein
    the at least one magnetic shielding element is longer in a peripheral direction of the at least two coil rings than in at least one of the longitudinal direction of the at least two coil rings or a radial direction of the at least two coil rings, or
    the at least one magnetic shielding element is longer in a direction tangential to the peripheral direction of the at least two coil rings than in at least one of the longitudinal direction of the at least two coil rings or the radial direction of the at least two coil rings.

6. The magnetic resonance imaging device of claim 2, wherein the at least one magnetic shielding element includes iron.

7. The magnetic resonance imaging device of claim 2, the magnetic resonance imaging device further comprising:
    an inner cover that surrounds the coil arrangement, the at least one magnetic shielding element being on the inner cover.

8. The magnetic resonance imaging device of claim 2, wherein the at least one electrical component is a coil, the coil including at least one of a magnetizable core or a transformer including the magnetizable core.

9. The magnetic resonance imaging device of claim 1, wherein at least one of
    an air gap is between the at least one electrical component and the at least one magnetic shielding element, or
    an magnetic spacer element is between the at least one electrical component and the at least one magnetic shielding element.

10. The magnetic resonance imaging device of claim 9, wherein
    the at least one magnetic shielding element is longer in a peripheral direction of the at least two coil rings than in at least one of the longitudinal direction of the at least two coil rings or a radial direction of the at least two coil rings, or
    the at least one magnetic shielding element is longer in a direction tangential to the peripheral direction of the at least two coil rings than in at least one of the longitudinal direction of the at least two coil rings or the radial direction of the at least two coil rings.

11. The magnetic resonance imaging device of claim 1, wherein
    the at least one magnetic shielding element is longer in a peripheral direction of the at least two coil rings than in at least one of the longitudinal direction of the at least two coil rings or a radial direction of the at least two coal rings, or
    the at least one magnetic shielding element is longer in a direction tangential to the peripheral direction of the at least two coil rings than in at least one of the longitudinal direction of the at least two coil rings or the radial direction of the at least two coil rings.

12. The magnetic resonance imaging device of claim 1, wherein the at least one magnetic shielding element includes iron.

13. The magnetic resonance imaging device of claim 12, wherein at least one of
    an air gap is between the at least one electrical component and the at least one magnetic shielding element, or
    an amagnetic spacer element is between the at least one electrical component and the at least one magnetic shielding element.

14. The magnetic resonance imaging device of claim 1, the magnetic resonance imaging device further comprising:

an inner cover that surrounds the coil arrangement, the at least one magnetic shielding element being on the inner cover.

15. The magnetic resonance imaging device of claim 14, wherein the at least one magnetic shielding element includes iron.

16. The magnetic resonance imaging device of claim 1, wherein the at least one electrical component is a coil, the coil including at least one of a magnetizable core or a transformer including the magnetizable core.

17. The magnetic resonance imaging device of claim 1, wherein an open side of the U-shaped cross-section is adjacent to the inner volume.

18. A magnetic resonance imaging device, the magnetic resonance imaging device comprising:
    at least one magnetic shielding element;
    at least one electrical component;
    at least one of an air gap between the at least one electrical component and the at least one magnetic shielding element or an amagnetic spacer element between the at least one electrical component and the at least one magnetic shielding element; and
    a coil arrangement including at least two coil rings, the at least two coil rings being offset along a longitudinal direction of a patient receptacle, and the coil arrangement being configured to form a magnetic field in an inner volume, the inner volume being partially surrounded by the at least two coil rings, and the patient receptacle being at least partially surrounded by the inner volume, wherein
        the at least one magnetic shielding element and the at least one electrical component are outside of the inner volume and are centrally between the at least two coil rings in a longitudinal direction of the at least two coil rings, and
        the at least one magnetic shielding element is configured to shield the at least one electrical component from a magnetic field.

19. A magnetic resonance imaging device, comprising:
    at least one magnetic shielding element;
    at least one electrical component;
    a coil arrangement including at least two coil rings, the at least two coil rings being offset along a longitudinal direction of a patient receptacle, and the coil arrangement being configured to form a magnetic field in an inner volume, the inner volume being partially surrounded by the at least two coil rings, and the patient receptacle being at least partially surrounded by the inner volume; and
    an inner cover that surrounds the coil arrangement, the at least one magnetic shielding element being on the inner cover, wherein
        the at least one magnetic shielding element and the at least one electrical component are outside of the inner volume and are centrally between the at least two coil rings in a longitudinal direction of the at least two coil rings, and
        the at least one magnetic shielding element is configured to shield the at least one electrical component from a magnetic field.

* * * * *